United States Patent
Thompson et al.

(10) Patent No.: US 6,518,637 B1
(45) Date of Patent: Feb. 11, 2003

(54) CUBIC (ZINC-BLENDE) ALUMINUM NITRIDE

(75) Inventors: Margarita P. Thompson, Detroit, MI (US); Gregory W. Auner, Livonia, MI (US)

(73) Assignee: Wayne State University, Detroit, MI (US)

( * ) Notice: Subject to any disclaimer, the term of this patent is extended or adjusted under 35 U.S.C. 154(b) by 0 days.

(21) Appl. No.: 09/544,914

(22) Filed: Apr. 7, 2000

Related U.S. Application Data

(60) Provisional application No. 60/128,662, filed on Apr. 8, 1999.

(51) Int. Cl.$^7$ ...................... H01L 29/82; H01L 31/0256
(52) U.S. Cl. ........................... 257/416; 257/76; 257/77; 257/625
(58) Field of Search ................ 257/76, 77, 416, 257/615, 625

(56) References Cited

U.S. PATENT DOCUMENTS

| | | | |
|---|---|---|---|
| 4,189,516 A | 2/1980 | Dryburgh et al. | 428/409 |
| 4,511,816 A | 4/1985 | Mikoshiba et al. | 310/313 |
| 4,879,787 A | 11/1989 | Sugai et al. | 310/313 A |
| 5,385,862 A | 1/1995 | Moustakas | 437/107 |
| 5,571,603 A | 11/1996 | Utumi et al. | 428/212 |
| 5,880,491 A | 3/1999 | Soref et al. | 257/190 |

FOREIGN PATENT DOCUMENTS

| | | | |
|---|---|---|---|
| EP | 0 669 412 A | 8/1995 | C30B/25/02 |

OTHER PUBLICATIONS

Auner, et al., Epitaxial Growth of AlN by Plasma Source Molecular Beam Epitaxy, *Wide Band Gap Electronic Materials*, pp. 329–334, ed. Prelas, et al., Kluwer Academic Publishers (1995).

Barski, et al., Epitaxial Growth of Cubic GaN and AlN on Si(001), *MRS Internet Journal of Nitride Semiconductor Research*, vol. 1, Article 21 (1996).

Cheng, et al., Selective Growth of Zinc–Blende, Wurtzite, or a Mixed Phase of Gallium Nitride by Molecular Beam Epitaxy, *Appl. Phys. Lett.*, vol. 66, No. 12, pp. 1509–1511 (Mar. 20, 1995).

(List continued on next page.)

*Primary Examiner*—Minh Loan Tran
(74) *Attorney, Agent, or Firm*—Rohm & Monsanto, PLC

(57) ABSTRACT

Device quality, single crystal film of cubic zinc-blend aluminum nitride (AlN) is deposited on a cubic substrate, such as a silicon (100) wafer by plasma source molecular beam epitaxy (PSMBE). The metastable zinc-blend form of AlN is deposited on the substrate at a low temperature by a low energy plasma beam of high-energy activated aluminum ions and nitrogen ion species produced in a molecular beam epitaxy system by applying a pulsed d.c. power to a hollow cathode source. In this manner, films having a thickness of at least 800 Å were produced. The lattice parameter of as-deposited films was calculated to be approximately 4.373 Å which corresponds closely to the theoretical calculation (4.38 Å) for cubic zinc-blend AlN. An interfacial layer of silicon carbide, specifically the cubic 3C—SiC polytype, interposed between the epitaxial film of zinc-blend AlN and the Si(100) wafer provides a template for growth and a good lattice match. The epitaxial layer of zinc-blend AlN has been characterized for its physical and optical properties. As a result, experimental data confirmed that zinc-blend AlN is an indirect semiconductor and has a bandgap about 5.34 eV. Due to the extraordinary piezoelectric properties of zinc-blend AlN, an illustrative device embodiment is a surface acoustic wave (SAW) device comprising interdigitated electrodes deposited by conventional means on the surface of the epitaxial layer of zinc-blend AlN to convert an electrical signal to a surface acoustic wave and vice versa.

13 Claims, 11 Drawing Sheets

OTHER PUBLICATIONS

He, et al., Molecular–Beam–Epitaxy Growth of GaN on GaAs(100) by Using Reactive Nitrogen Source, *Appl. Phys. Lett.* vol. 64, No. 3, pp. 315–317, Jan. 17, 1994).

Hultman, et al., Interfacial Reactions in Single–Crystal–TiN(100)/Al/Polycrystalline–TiN Multilayer Thin Films, *Thin Solid Films*, vol. 215, pp. 152–161 (1992).

Kikuchi, et al., Substrate Nitridation Effects on GaN Grown on GaAs Substrates by Molecular Beam Epitaxy Using RF–Radical Nitrogen Source, *Jpn. J. Appl. Phys.* vol. 33, pp. 688–693 (1994).

Okumura, et al., Growth and Characterization of Cubic GaN, *J. Crys. Growth*, vol. 178, pp. 113–133 (1997).

Paisley, et al., Growth of Cubic Phase Gallium Nitride by Modified Molecular–Beam Epitaxy, *J. Vac. Sci. Technol.*, vol. A 7, No. 3, pp. 701–705 (May/Jun. 1989).

Paisley, et al., Molecular Beam Epitaxy of Nitride Thin Films, *J. Crys. Growth*, vol. 127, pp. 136–142 (1993).

Patent Abstracts of Japan, vol. 012, No. 028 (C–471) dated Jan. 27, 1988 relating to JP 62 176996 A published Aug. 3, 1987.

Patent Abstracts of Japan, vol. 1998, No. 04 published Mar. 31, 1998 relating to JP 09 309795 A published Dec. 2, 1997.

Petrov, et al., Synthesis of Metastable Epitaxial Zinc–Blende–Structure AIN by Solid–State Reaction, *Applied Phys. Lett.*, vol. 60, pp. 2491–2493 (1992).

Powell, et al., Heteroepitaxial Wurtzite and zinc–Blende Structure GaN Grown by Reactive–Ion Molecular–Beam Epitaxy: Growth Kinetics, Microstructure, and Properties, *J. App. Phys.*, vol. 73, No. 1, pp. 189–204 (1993).

Schenk, et al., Investigation of Two–Dimensional Growth of AIN(0001) on SI(111) by Plasma–Assisted Molecular Beam Epitaxy, *J. Crys. Growth*, vol. 200, No. 1–2, pp. 45–54 (Apr 1, 1999).

Seifert, et al., Cubic Phase Gallium Nitride by Chemical Vapour Deposition, *Phys. Stat. Sol.*, (a) vol. 23, pp. K39–K40 (1974).

Sherwin, Predicted Elastic Constants and Critical Layer Thicknesses for Cubic Phase AIN, GaN, and InN on β–SiC, *J. Appl. Phys.*, vol. 69, No. 12, pp. 8423–8425 (Jun. 15, 1991).

Strite, et al., An Investigation of the Properties of Cubic GaN Grown on GaAs by Plasma–Assisted Molecular–Beam Epitaxy, *J. Vac. Sci. Technol.*, vol. B9, No. 4, pp. 1924–1929 (Jul./Aug. 1991).

Strite, et al., Structural Properties of InN Films Grown on GaAs Substrates: Observation of the Zincblende Polytype, *J. Crys. Growth*, vol. 127, pp. 204–208 (1993).

Thompson, et al., Epitaxial Growth of Cubic AIN on Si(001) by Plasma Source Molecular Beam Epitaxy, Abstract, Materials Research Society 1999 Spring Meeting, Symposium V: Epitaxial Growth–Principles and Applications (1999).

Xia, et al., Pressure–Induced Rocksalt Phase of Aluminum Nitride; A Metastable Structure at Ambient Condition, *J. Appl. Phys.*, vol. 73, No. 12, pp. 8198–8200 (Jun. 15, 1993).

Yeh, et al., Zinc–Blende–Wurtzite Polytypism in Seniconductors, vol. 46, No. 16, *Physical Review B*, p. 10 086– 10 097 (Oct. 15, 1992).

Yoshida, et al., Hetero–Epitaxial Growth of Cubic GaN on GaAs by Gas–Source Molecular Beam Epitaxy, *Surface Science*, vol. 267, pp. 50–53 (1992).

Zi, et al., Lattice Dynamics of Zinc–Blende GaN and AIN: I. Bulk Phonons, *J. Phys.: Condens. Matter*, vol. 8, pp. 6323–6328 (1996).

Kim, et al., Growth by Molecular Beam Epitaxy and Electrical Characterization of Si–Doped Zinc Blende GaN Films Deposited in β–SiC Coated (001) Si Substrates, *Appl. Phys. Lett.*, vol. 65, No. 1, pp. 91–93 (Jul. 4, 1994).

Kuo, et al., Microstructure and Thermal Conductivity of Epitaxial AIN Thin Films, *Thin Solid Films*, vol. 253, No. 1/02, pp. 223–227 (Dec. 15, 1994).

Kuznia, et al., Low Pressure Metalorganic Chemical–Vapor Deposition of Cubic GaN Over (100) GaAs Substrates, *Appl. Phys. Lett.*, vol. 65, No. 19, pp. 2407–2409 (Nov. 7, 1994).

Lei, et al., Epitaxial Growth of Zinc Blende and Wurtzitic Gallium Nitride Thin Films on (001) Silicon, *Appl. Phys. Lett.*, vol. 59, No. 8, pp. 944–946 (Aug. 19, 1991).

Lei, et al., Epitaxial Growth and Characterization of Zinc–Blende Gallium Nitride on (001) Silicon, *Appl Phys. Lett.*, vol. 71, No. 10, pp. 4933–4943 (May 15, 1992).

Lin, et al., p–Type Zinc–Blende GaN on GaAs Substrates, *Appl. Phys. Lett.*, vol. 63, No. 7, pp. 932–933 (Aug. 16, 1993).

Lin, et al., Epitaxial Growth of Cubic AIN Films on (100) and (111) Silicon by Pulsed Laser Ablation, *Appl. Phys. vol. 66, Lett.*, No. 16, pp. 2066–2068 (Apr. 17, 1995).

Liu, et al., Growth of Zinc Blende–GaN on β–SiC Coated (001) Si by Molecular Beam Epitaxy Using a Radio Frequency Plasma Discharge, Nitrogen Free–Radical Source, *J. Appl. Phys.*, vol. 74, No. 10, pp. 6124–6127 (Nov. 15, 1993).

Madan, et al., Stabilization of Cubic AIN in Epitaxial AIN/TiN Superlattices, *Phys. Rev. Lett.*, vol. 78, No. 9, pp. 1743–1746 (Mar. 3, 1997).

Miyoshi, et al., MOVPE Growth of Cubic GaN on GaAs Using Dimethylhydrazine, *J. Crys. Growth*, vol. 124, pp. 439–442 (1992).

Nagahara, et al., Selective Growth of Cubic GaN in Small Areas on Patterned GaAs(100) Substrates by Metalorganic Vapor Phase Epitaxy, *Jpn. J. Appl. Phys.*, vol. 33, pp. 694–697, Part 1, No. 1B (Jan. 1994).

Okubo, et al., Formation of Cubic–AIN Layer on MgO(100) Substrate, *J. Crys. Growth*, vol. 189/190, pp. 452–456 (Jun. 2, 1998).

Okumura, et al., Epitaxial Growth of Cubic and Hexagonal GaN by Gas–Source Molecular Beam Epitaxy, *Appl. Phys. Lett.*, vol. 59, No. 9, pp. 1058–1063 (Aug. 26, 1991).

Okumura, et al., Epitaxial Growth of Cubic and Hexagonal GaN by Gas Source Molecular Beam Epitaxy Using a Microwave Plasma Nitrogen Source, *J. Crys. Growth*, vol. 136, pp. 361–365 (1994).

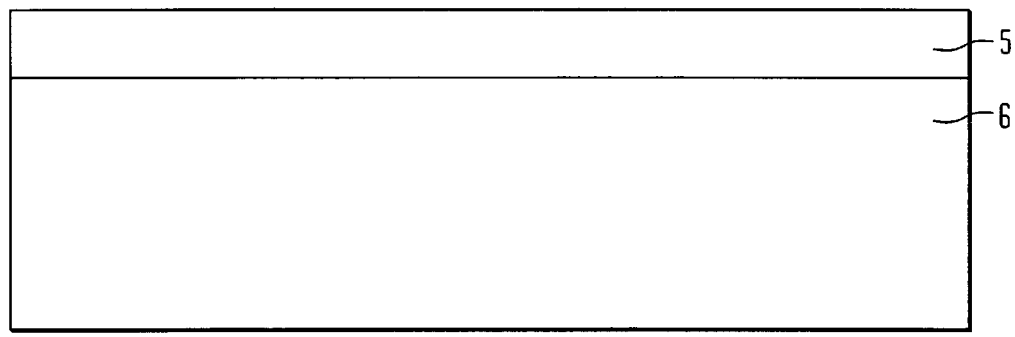
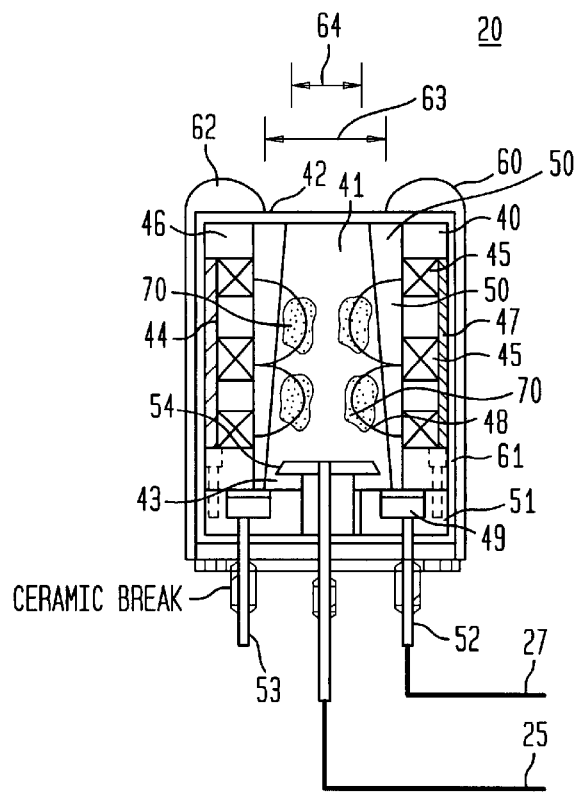

CUBIC (ZINC-BLENDE) ALUMINUM NITRIDE

CROSS-REFERENCE TO RELATED APPLICATIONS

This application claims the benefit of provisional patent application No. 60/128,662 filed Apr. 18, 1999 and assigned to the assignee herein.

BACKGROUND OF THE INVENTION

1. Field of the Invention

This invention relates generally to aluminum nitride (AlN) and more particularly, to epitaxial cubic (zinc-blende) AlN films that may have a thickness on the order of 1000 Å or greater and a method of making same by plasma source molecular beam epitaxy (PSMBE).

2. Description of the Related Art

The Group III-V nitride semiconductors (GaN, AlN, and InN) are of great interest for their potential as optoelectronic materials. These materials have an equilibrium crystal structure which is wurtzite, or hexagonal. The bandgaps of the wurtzite nitride semiconductors are all direct and their alloys have a continuous range of direct bandgaps values ranging from 1.9 eV for InN to 4.0 eV for GaN to 6.2 eV for AlN. As optical materials, these semiconductors are active from the orange into the ultraviolet.

Formation of nitride semiconductors for device applications requires, among other things, achieving the correct stoichiometry, inducing the correct energy to form a highly crystalline matrix, maintaining high purity, and matching the lattice parameters of the semiconductor and the substrate. Much effort was expended in the 1960's and 1970's to grow and characterize Group III-V nitride semiconductors. However, the effort was ineffectual to achieve high-quality material. Recently, there has been renewed effort to create higher quality Group III-V nitride semiconductors. However, GaN, AlN, and InN produced by conventional methods have high n-type background carrier concentrations resulting from native defects commonly thought to be nitrogen vacancies. Nitrogen vacancies affect the electrical and optical properties of the film. Oxygen contamination is also a major problem. Thin layers of AlN have been prepared by magnetron sputtering, chemical vapor deposition, ion beam sputtering, and ion beam assisted deposition. However, these methods operate at elevated temperatures and generally do not result in epitaxial growth (i.e., growth oriented in one direction). Moreover, while these techniques have been successful in producing polycrystalline AlN films, they have not been successful in producing electronic-grade single crystal films.

AlN, in particular, is a promising material for high-power, high-temperature optoelectronic devices since it has very high chemical and thermal stability, good thermal conductivity, and fast Rayleigh velocity. AlN crystallizes, under normal conditions, into the thermodynamically stable hexagonal wurtzite structure. However, the metastable cubic zinc-blende structure is expected to be easier to dope and to have decreased phonon scattering, and therefore, to have higher ballistic electron velocities, thermal conductivity, and acoustic velocities due to its higher symmetry. These properties give rise to many exciting potential device applications.

There have been several reports of AlN having the metastable cubic zinc-blende structure. These reports, however, lack detail on the physical, electrical, and optical properties of cubic zinc-blende AlN because the films were too thin for such studies, and certainly too thin to be useful for optoelectronic devices which require thicknesses on the order of at least 2000 Å, and preferably 4000 Å to 8000 Å. The lattice constant of zinc-blende AlN was calculated theoretically to be 4.38 Å using data from the elastic constants of wurtzite AlN. This value was later confirmed experimentally on a 12 nm thick film of zinc-blende AlN grown pseudomorphically on cubic TiN sandwiched between a tetragonal $Al_3Ti$ overlayer. To date, however, there have been no reports of successful fabrication of thick, device-quality films of zinc-blende AlN. The known AlN films have been mixed hexagonal and possibly cubic (which could be the rock salt structure).

It is, therefore, an object of the invention to prepare zinc-blende AlN of sufficient quality and thickness to characterize it for its mechanical, optical, and electrical properties and to be useful for device fabrication.

It is also an object of the invention to prepare device quality, single crystal, epitaxial films of cubic zinc-blende AlN.

It is a further object of the invention to produce a semiconductor devices that include an epitaxial film(s) of single crystal zinc-blende AlN.

It is an additional object of this invention to provide a method of making an epitaxial film of zinc-blende AlN.

SUMMARY OF THE INVENTION

The foregoing and other objects, features and advantages are achieved by this invention which is, in a first device embodiment, a film of device quality, single crystal cubic zinc-blende AlN. In other embodiments, the zinc-blende AlN film is deposited on a substrate, and preferably on a substrate having cubic symmetry on its surface, such as a silicon (100) wafer (Si(100)). In a particularly preferred embodiment, there is a buffer, or an interfacial, layer of cubic 3C—SiC between the epitaxial film of zinc-blende AlN and the substrate which may be a Si(100) wafer.

In a specific illustrative embodiment, a semiconductor device comprises a Si(100)-oriented substrate; an interfacial layer of 3C—Si(C) on the Si(100) substrate; and a film of single crystal zinc-blende AlN having a thickness of at least 800 Å, and preferably in the range of 1000 Å to 2000 Å, which is epitaxial with respect to the Si(100) substrate. The epitaxial relationship between film and substrate is (100) AlN‖(100)Si and [101]AlN‖[101]Si. The interfacial layer may have a thickness ranging from several atomic layers (e.g., about 25–30 nm) and up.

In accordance with the principles of the invention, the metastable zinc-blende form of AlN is deposited on the substrate by a plasma beam of aluminum ions and activated nitrogen ion species produced in a molecular beam epitaxy system by applying a pulsed d.c. power to a hollow cathode source. In this manner, films having a thickness of at least 800 Å were produced. Thickness, of course, is a function of deposition time, and films ranging from 10 Å to several microns, are possible by the method of the present invention. The lattice parameter of the as-deposited films was calculated to be approximately 4.373 Å which corresponds closely to the theoretical calculation (4.38 Å) for cubic zinc-blende AlN.

The zinc-blende AlN epilayer films of the present invention have a wide bandgap (experimentally determined to be about 5.34 eV); thermal stability (up to about 800° C.), and extraordinary piezoelectric properties. In addition to the foregoing, the films have been of sufficient quality to enable experimental confirmation that zinc-blende AlN is an indirect semiconductor. When characterized in situ by Reflection High Energy Electron Diffraction (RHEED), the films show four-fold symmetry rather than the six-fold symmetry which is typical for hexagonal AlN in (0001) orientation. Furthermore, the RHEED patterns appear to be very similar to those for the Si(001) substrates, except for different streak spacings. X-ray diffraction (XRD) revealed broad peaks at diffraction angle (2θ) values of approximately 41° and 89.8°. These peaks match the (002) and (004) peaks of zinc-blende AlN with a lattice parameter of 4.38 Å. Transmission electron microscopy (TEM) confirmed that the AlN produced by the method of the present invention is cubic, single crystal and epitaxial with respect to the Si(100) substrate.

In accordance with the invention, the growth surface of the substrate should preferably have a cubic structure to act as a template for cubic (zinc-blende) growth. Specific illustrative examples include, but are not limited to Si(100) and magnesium oxide (MgO (100)). Of course, the substrate may comprise one or more layers. Preferably, the growth surface of the substrate should have an good lattice match with AlN. A good lattice match is defined as being within about 1%. However, as is known in the art, substrates with seemingly poor lattice matches (e.g, Si(100) has a 19% mismatch), may be used since epitaxially deposited layers have mechanisms to compensate for the mismatch, such as by forming defects.

3C—SiC is an example of a substrate that has less than 1% lattice mismatch with AlN. In a particularly preferred embodiment, there is a buffer layer, or an interfacial layer, of cubic 3C—SiC between the epitaxial film of zinc-blende AlN and a Si(100) wafer. The 3C—SiC layer may have a thickness ranging from several atomic layers (e.g., about 25–30 nm) and up. A silicon substrate with a 3C—SiC layer can be purchased from a commercial source or made in the laboratory. The 3C—SiC layer can be deposited on a silicon substrate by any number of known, high temperature processes, such as chemical vapor deposition or enhanced MBE. As will be described more completely hereinbelow, 3C—SiC can be made in situ on a silicon substrate by the methods in accordance with the invention herein.

In a specific illustrative embodiment of one of the many device applications contemplated by the invention, an interdigitated transducer surface acoustic wave (SAW) device comprises a Si(100) substrate, an epitaxial film of single crystal, zinc-blende film of AlN deposited on the substrate, and two interdigitated electrodes deposited on the epitaxial AlN film by standard photolithographic techniques.

In a method embodiment of the present invention, a single crystal, epitaxial AlN film having a zinc-blende cubic structure is formed by exposing a heated substrate to a low energy flux of target atoms in an ultrahigh vacuum PSMBE system. The PSMBE system uses a plasma deposition source which is a magnetically-enhanced, generally cylindrical hollow chamber comprising a cathode. The chamber is lined with the target material which, in the present case, is MBE-grade aluminum. The target material is milled so that its thickness is greater at the upper, or exit, end of the chamber than the thickness at the lower end. In a preferred embodiment of the invention, there is about a 3° internal taper in the chamber. Plasma is formed in the chamber by the application of d.c. or r.f. power. The application of a pulsed d.c. power produces an epitaxial layer of metastable zinc-blende AlN. The magnetic field and the taper of the interior of the cathode cooperate to confine the plasma to the cathode. The low energy flux of target atoms is extracted from the exit end of the chamber either by the action of an impeller rotatably mounted in the cathode source or by an acceleration bias applied to the substrate.

Secondary electrons are confined to the hollow cathode source and do not interact with the substrate which is mounted distant from the exit end of the chamber by, in a specific preferred embodiment, approximately 25 cm. Due to the extreme anisotrophy of the kinetically ejected atoms perpendicular to the source wall and the tapered geometry of the hollow cathode chamber, virtually no high-energy atoms or ions are directed to the substrate surface. Instead, the atoms go through multiple collisions and thermalize. Since ions are extracted from the source via an impeller or acceleration bias, the energy distribution is controlled. Mass spectrometry energy analysis of the non-accelerated ions ejected from the r.f. powered source indicates a gaussian energy distribution about the approximate 1 eV range.

The PSMBE system of the present invention, in contrast to planar sputtering systems, allows enough adatom energy to create AlN crystals (or other semiconductor nitrides) while minimizing damage to the underlying crystal substrate. When pulsed d.c. power is used instead of r.f.power, the prolonged high potential state of the pulse combined with the delay time between pulses results in more energetic plasma with high plasma and Al/N kinetic energies. The increased intensity of the plasma gives more dissociated and hence, more energetic, aluminum and nitrogen species for deposition on the substrate. This increase in the plasma energy and active energetic species assists in the formation of cubic zinc-blende AlN.

In a further method aspect of the present invention, the substrates are pre-treated to de-grease the substrate with solvents and to remove surface oxidation. The substrate is then, preferably pre-heated to a high temperature, illustratively approximately 800° C., for one hour before deposition of the epixtaxial film.

In a specific illustrative embodiment, a Si(100) substrate is pre-treated by (i) ultrasonic cleaning in acetone for 20 minutes; (ii) blow-drying with dry nitrogen; (iii) ultrasonic cleaning in methanol for 20 minutes; and (iv) blow-drying with dry nitrogen. The substrate is then etched in an acid, illustratively 10% (by volume) HF to remove the $SiO_2$ layer from the surface and to saturate dangling Si bonds with hydrogen atoms. The substrate is then loaded into the deposition chamber, preferably within 10 minutes of treatment.

In a particularly preferred embodiment, the pre-treated Si(100) substrate is subjected to a source of carbon to combine with the Si, during the pre-heat, to create an interfacial layer of cubic 3C—SiC on the Si(100) of at least several atomic layers thickness. The cubic 3C—SiC acts as a template for the deposition of cubic zinc-blended AlN. Illustratively a source of carbon can be introduced during the etching step by including trace amounts of a mixture of hydrocarbons in the etching solution. For example, the hydrocarbons may be the resins found in standard photoresist materials.

In an additional embodiment of the invention, a PSMBE system useful in preparing epitaxial films on a substrate comprises an ultrahigh vacuum growth chamber. An ultrahigh vacuum pump is connected to the growth chamber so that base pressures in the range $10^{-9}$–$10^{-10}$ torr can be achieved and maintained.

A substrate holder is, preferably, rotatably mounted in the interior upper end of the growth chamber. The substrate holder is heated to bring a substrate mounted thereon to growth, or processing, temperature. A substrate bias power supply is electrically connected to the substrate holder.

At least one plasma deposition source, and preferably from two to eight sources, is located distal to the substrate holder to achieve an appropriate distance, preferably in the range of 5 cm to 50 cm, from the exit end of the source to the deposition, or growth, surface of the substrate. The plasma deposition source, in a preferred embodiment, is a magnetically-enhanced hollow cylindrical cathode lined with target material which, in this specific embodiment, is aluminum. The plasma deposition source includes an inlet for high purity process gases, specifically nitrogen and argon. A source of pulsed d.c. or r.f. power is electrically connected to the plasma deposition source for creating a of plasma of high-energy aluminum, nitrogen, and argon species. An impeller is rotatably mounted in the plasma deposition source for ejecting ions from the source. The cathode source is surrounded by an anode, which may be a stainless steel enclosure, at an insulating distance from the cathode.

In a preferred embodiment of the invention, the plasma deposition source is a cathode comprising a hollow, generally cylindrical chamber, the chamber having an opening at the upper end for emitting the generated plasma and an inlet at the lower end for the process gases. The source includes magnetic field generating means. In this specific embodiment, the magnetic field generating means is an array of magnets embedded in aluminum and forming the exterior wall of the chamber. The magnetic field confines the plasma to the hollow chamber. The target material forms the interior lining of the chamber wall. The thickness of the target material lining the chamber increases from the lower end to the upper end to provide a taper that further confines the plasma to the interior of the chamber. In a specific embodiment, the lining has a 3° taper.

BRIEF DESCRIPTION OF THE DRAWING

Comprehension of the invention is facilitated by reading the following detailed description, in conjunction with the annexed drawing, in which:

FIG. 1 is an schematic cross-sectional representation of a bilayer semiconductor device in accordance with the present invention;

FIG. 3 is a schematic representation of a magnetically-enhanced hollow cathode plasma deposition source in accordance with the present invention;

DETAILED DESCRIPTION

Figure 2:
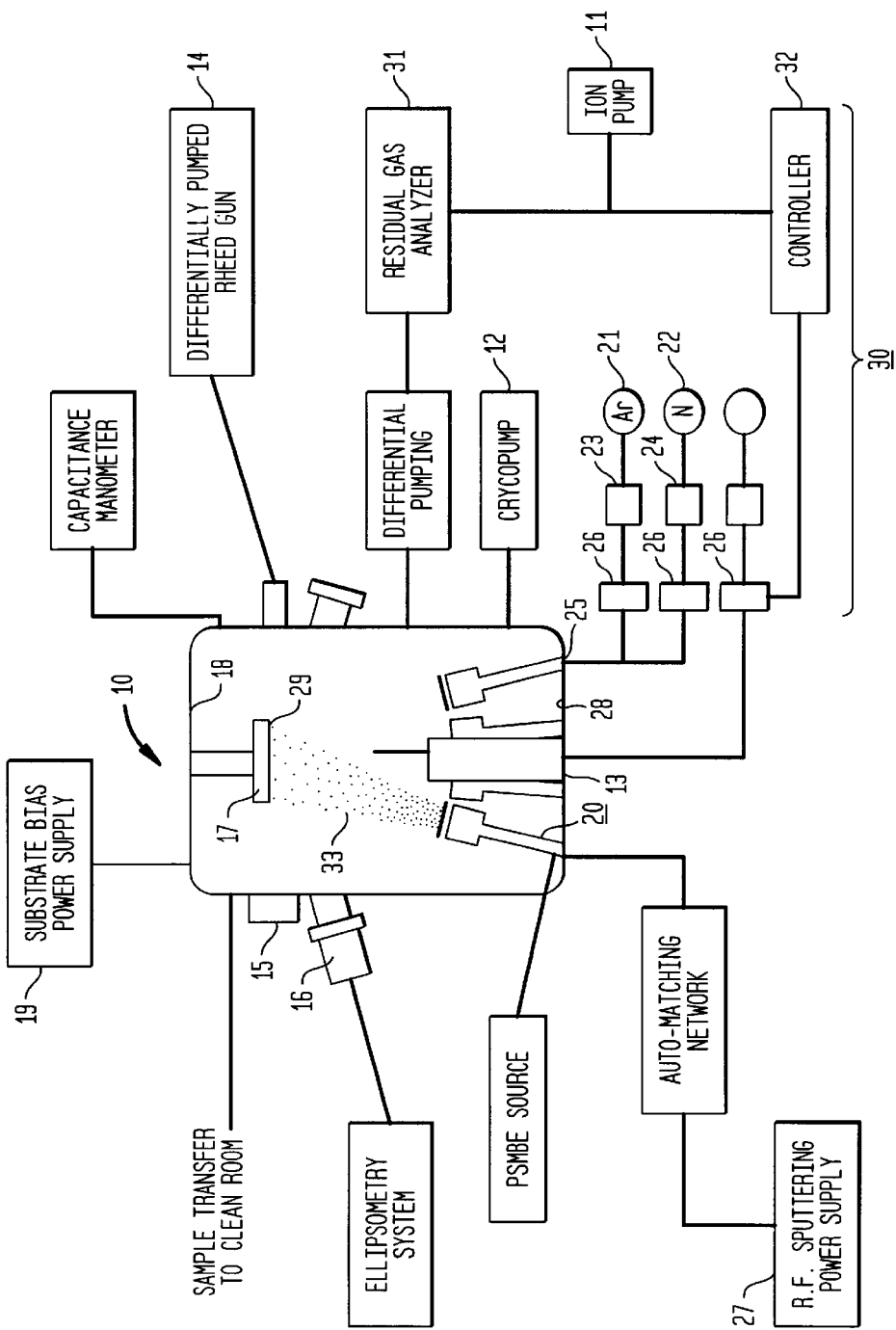
FIG. 2 is an illustrative schematic diagram of a PSMBE system useful in the practice of the invention.

In an illustrative device embodiment 8, shown schematically in cross-section in FIG. 1, a single crystal zinc-blende AlN film 5 is epitaxially deposited on a face surface of a substrate 6, illustratively, Si(100). In this specific illustrative embodiment, the AlN film is epitaxial with respect to the Si(100) substrate and has a thickness on the order of 1000 Å. The epitaxial relationship between film and substrate is (100)AlN||(100)Si and [101]AlN||[101]Si.

In particularly preferred embodiments, a buffer layer of a material having a cubic structure and a good lattice match with the zinc-blende AlN film is interposed between epitaxial layer 5 and substrate 6. In a specific illustrative embodiment, the buffer layer is an interfacial layer of 3C—SiC. An interfacial layer of 3C—SiC is clearly shown in FIG. 6 as reference numeral 7.

Devices in accordance with the present invention are preferably fabricated by the PSMBE technique described in detail hereinbelow.

An illustrative schematic diagram of a PSMBE system useful in the practice of the invention is shown in FIG. 2. An ultrahigh vacuum (UHV) growth chamber 10 is pumped by an ion pump 11 (e.g., 500 l/s) to achieve base pressures in the range $10^{-9}$–$10^{-10}$ torr. In the specific embodiment shown, a throttled cryopump 12 assists in maintaining the vacuum under dynamic gas flow conditions. Although not specifically shown in the figure, a sample load lock system maintains vacuum chamber integrity. The temperature of growth chamber 10 is monitored by a temperature measurement system 13, such as an IR temperature measurement system.

The growth chamber may also be fitted with observation and analytical equipment. In the embodiment shown, a differentially-pumped RHEED gun 14 and RHEED screen with charge-coupled device (CCD) camera 15 are included. In addition, the embodiment of FIG. 2 has as an ellipsometry system 16 for evaluating optical properties.

A substrate holder 17 having a mounting surface 29 is rotatably mounted to the upper interior surface 18 of growth chamber 10. Substrates are preferably rotated continuously during deposition to insure uniform thickness. Large substrates (up to 3 inch wafers) may be used successfully in this manner. Substrate holder 17 is heated, illustratively radiantly or resistively, to bring a substrate (not specifically shown in the figure) mounted on surface 29 to high temperatures, preferably between about 400° C. to 800° C. Substrate holder 17 is electrically connected to a substrate bias power supply 19.

There is at least one plasma deposition source, illustratively, plasma deposition source 20 mounted to the lower interior surface 28 of growth chamber 10 at an appropriate target-to-substrate distance from the face, or growth, surface of a substrate mounted on substrate holder 17. In this specific embodiment, the distance is 25 cm. The source may be mounted off-axis up to 20° from normal. In accordance with the present invention, plasma deposition source 20 is a magnetically-enhanced hollow cathode plasma deposition source, lined with metallic target material, that is described in greater detail with respect to FIG. 3.

Process gases, specifically argon and nitrogen in this embodiment, from sources 21 and 22 are purified to sub-ppb levels in titanium and copper gettering furnaces 23 and 24, respectively. The purified gases are introduced into a plasma deposition source, illustratively at gas inlet 25 through mass flow controllers 26. A source of pulsed d.c. or r.f. power 27 is electrically connected to the hollow cathode source for creating a plasma of high-energy aluminum, nitrogen, and argon species in the plasma deposition source 20 in response to applied power, and preferably pulsed d.c. power between 100 W and 300 W for epitaxial growth of zinc-blende AlN. In this embodiment, the power supply is an ENI, model RPF-50 set at the standard delay pulse. The source emits a low energy flux 33 of the activated, high-energy aluminum, nitrogen, and argon species. In some embodiments, a negative bias may be applied to the substrate to accelerate the activated species emerging from the hollow cathode plasma source. In this embodiment, predominantly $Al^+$ and $N^+$ flow toward the heated substrate and form a film on a front surface thereof. The process gases are controlled by mass flow control system 30 so that the dynamic pressure during deposition, in this particular embodiment, is approximately 5 mTorr. In mass control system 30, gas compositions are monitored and controlled by a differentially-pumped UTI mass spectrometer 31 connected through controller 32 for feedback control of deposition parameters, such as gas flow and partial pressures, substrate temperatures, plasma densities, r.f. target and substrate bias, and plasma source induced ion-solid interactions for synthesis of almost any thin film material.

FIG. 3 is a schematic representation of a magnetically-enhanced hollow cathode plasma deposition source 20 in accordance with the present invention. Elements of structure that are common to FIG. 2 are similarly designated in this figure. Plasma deposition source 20 comprises a cathode 40 defined by a hollow cylindrical chamber 41 having a wall, an upper, or exit, end 42 and a lower end 43. The exterior wall of cathode 40 comprises cylindrical magnetic field generating means 44.

In this embodiment, magnetic field generating means 44 comprises an array of magnets 45 embedded in a cylinder of aluminum 46. In this specific example, the array contains 24 magnets: eight magnets around the circumference of the cylinder by three magnets along the length of the cylinder. The lengthwise magnets are connected by magnet returns 47. Magnets 45 are, illustratively, rare earth SmCo plated with Ni, and the magnet returns 47 are iron-coated titanium nitride. In this manner, a magnetic field, illustrated by field lines 48, having a strength of greater than 1 KG is generated to confine plasma 70 to the hollow cathode.

The interior wall of cathode 40 is source target material 50, specifically MBE grade aluminum in this embodiment, that has been milled to have a thickness that increases from lower end 43 to upper end 42 so as to provide a taper that further confines plasma 70 to the interior of the cylindrical chamber. In this specific embodiment, the taper is 3°.

The lower end 43 of cathode 40 is mounted on a conductive cathode mounting block 51. Cathode mounting block 51 includes a water-cooling channel 49 having a water inlet 52 and a water outlet 53. In this embodiment, the power supply 27 is integrated into the water cooling lines. An impeller 54 is rotatably mounted in mounting block 51. Impeller 54 may be at ground potential or, alternatively, may be rigged for bias and electrically isolated from the mounting block. In this specific embodiment, impeller 54 is MBE grade aluminum. Impeller 54 includes gas inlet 25 for process gases.

The plasma source 20 further comprises an anode 60 which is configured to surround the cathode at an insulating gap 61. Anode 60 includes a cap 62 at the upper end thereof having an opening 63 which is greater than the opening 64 at the upper end of the cathode. The opening 64 at the upper end of the cathode emits the low energy flux of activated ions.

The PSMBE system described herein can be used to grow AlN films, as well as nitride films of other compositions, such as GaN or InN, by varying the target and process gas components. The thermodynamically stable wurtzite form of AlN and the metastable zinc-blend form may be fabricated selectably in the same PSMBE system by varying the process conditions as illustratively set forth in Table 1.

TABLE 1

| Parameter | Hexagonal (wurtzite) A/N | Cubic (Zinc-Blende) A/N |
|---|---|---|
| Dynamic Gas Pressure | 1–10 mTorr | 1–10 mTorr |
| Argon Flow | 20–40 sccm | 20–40 sccm |
| Nitrogen Flow | 20–40 sccm | 2–40 sccm |
| Substrate Temperature | 300° C.–900° C. | 300° C.–800° C. |
| r.f. Power (to source) | 100 W–300 W | 0 |
| Pulsed d.c. Power | 0 | 100 W–300 W |
| Acceleration Bias (substrate) | 12 V–15 V (neg.) | 0–15 V (neg.) |
| Substrates | Si(111), $Al_2O_3$ R-plane, $Al_2O_3$ (C-plane), 6H-SiC | Si(100), 3C-SiC, and MgO(100), or combinations thereof |

Of course, in addition to the Group III-V nitride semiconductors described herein, and their alloys, the PSMBE system can be adapted to fabricate semiconductor devices from other elements, and to form heterostructure devices of varying composition. The system can readily be adapted, as is known in the art, to include a source of donor or acceptor electrons to form p-n junction devices. For a p-type material, an acceptor source (Group II elements, such as Be, Zn, Cd, and Ca) is included during growth whereby the acceptor takes on an electron and is incorporated into the AlN lattice as a negatively charged species. The substrate is bombarded with electrons either by applying a positive bias to the substrate surface or to a metal grid placed directly in front of the substrate. For an n-type material, the substrate is bombarded with positive ions by biasing either the substrate or a grid positioned in front of the substrate negatively so that the donor impurities incorporate into the AlN in their charged states (Group IV and VI elements, such as Si, Ge, O, S).

SPECIFIC EXAMPLES

Prior to being loaded in the PSMBE growth chamber described hereinabove with respect to FIGS. 2 and 3, a Si(100) substrate was de-greased ultrasonically in acetone and methanol and blown dry with nitrogen. The substrate was then etched for 1 minute in 10% (by volume) hydrofluoric acid (HF) and immediately loaded into the PSMBE chamber. The etching solution also contained a trace amount of hydrocarbon impurity from standard photoresist material. Before deposition, the substrate was heated to approximately 800° C. for one hour which resulted in a (2×1) reconstruction as observed by RHEED.

Using MBE grade aluminum as the target material in the magnetically-enhanced hollow cathode source described in detail with respect to FIG. 3, a highly purified gas mixture, consisting of 40 sccm Ar and 2 sccm $N_2$, at a dynamic pressure of 5 mTorr, was supplied into the cathode source. The dynamic pressure of the source gases should be controlled to the generated plasma stable. The Si(100) substrate was heated to a growth temperature of 650° C. Pulsed d.c. (square wave) power was suppled to the conductive cathode of the source to generate plasma. The d.c. power supply parameters in this specific embodiment are shown below in Table 2

TABLE 2

| d.c. power supply parameters | |
|---|---|
| Average d.c. Power | 100 W |
| Duty Cycle Power | 25.3% |
| Average Current | 1.04 A |
| Peak Voltage | −260 V |

Several films were deposited on Si(100) substrates in this manner at a deposition rate of approximately 10–15 Å/hr. The impeller in the source was held at ground potential. An acceleration bias of 0 or −12V was applied to the substrate. Two films, having a thickness of 800 Å and 960 Å, respectively, as measured by piezoelectric resistance, were characterized in situ and are discussed hereinbelow. The first film (herein designated "Film 1") was deposited with an acceleration bias of −12V applied to the substrate. The second film (herein designated "Film 2") was deposited with no bias. The films were not subjected to any post-growth processing, such as annealing.

Structural Characteristics of the Zinc-blende AlN Films

The films were characterized in situ by a STAIB RHEED system (model NEK-2035-R) operating at an accelerating voltage of 30 keV during and after growth. The RHEED patterns indicate that both films have a four-fold symmetry. The orientation of the films with respect to the substrate is (100)z-bAlN∥(100)Si and [101]z-bAlN∥[101]Si.

Figure 4:
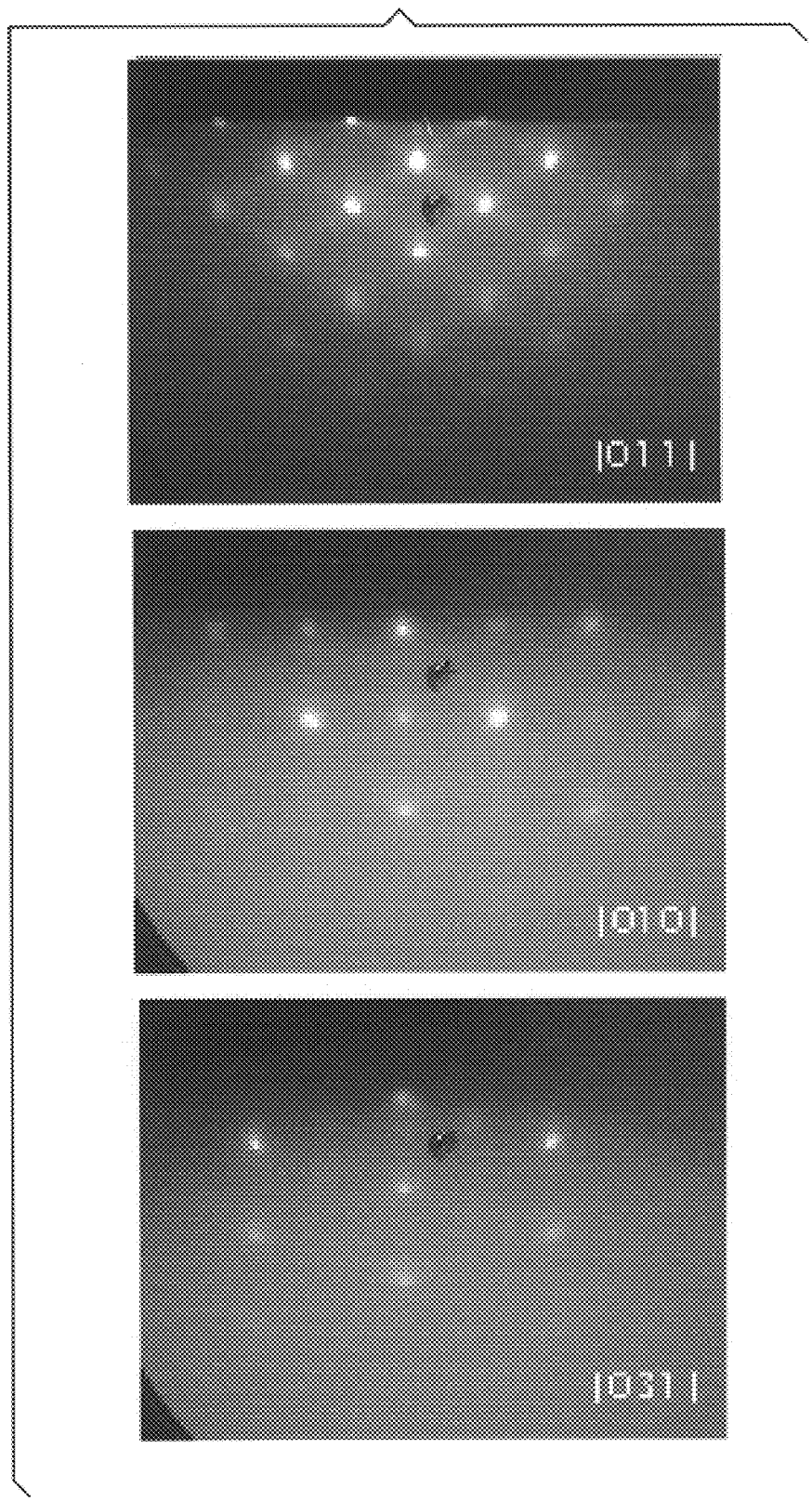
FIG. 4 is a RHEED pattern from a zinc-blende AlN film fabricated in accordance with the method of the present invention, taken at azimuths of [101], [100], and [310]

FIG. 4 is a RHEED pattern from Film 1 taken at azimuths of [010], [011], and [031]. Very similar patterns were observed for Film 2. The RHEED patterns are spotty and not streaky due to transmission-reflection which indicates surface roughness. The pattern is formed due to transmission electron diffraction from the surface asperities rather than pure reflection from the film surface. The presence of spots, as opposed to rings, in the RHEED patterns during and after deposition is an indication that the films are single crystalline and that all grains are oriented along the [100] direction.

Figure 5:
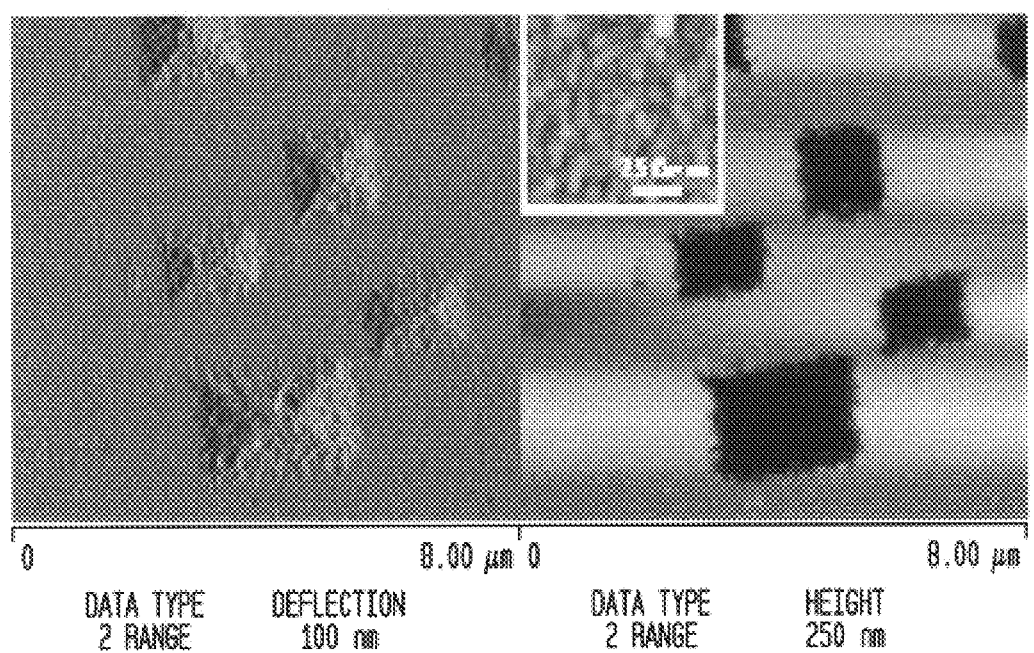
FIG. 5 is a deflection image taken by atomic force microscopy (AFM) of the surface of an AlN film fabricated in accordance with the present invention, a height image is shown in the inset.

The films were further characterized by AFM using a Digital Instruments Nanoscope III in contact mode with standard $Si_3N_4$ tips. FIG. 5 shows deflection and height images of the surface of Film 1 taken by AFM.

The height AFM images revealed the presence of regular square pyramidal pits having based edges of up to 2 $\mu$m on the surface of both films. The squareness of the pyramids indicates that the films are cubic. It appears that some of these pyramidal pits originate on the AlN/Si interface. The deflection images show that these pyramids have well-defined edges and walls. All pyramids are oriented along a certain direction. From the symmetry of the cubic structure, it can be deduced that the pyramidal sides are parallel to the {111} planes and the pyramids are oriented along the <110> directions. A height image from the surface between the pyramidal pits is shown in the inset and indicates a grain structure having an RMS roughness of approximately 4.4 nm. This roughness explains the presence of spots, rather than streaks, in the RHEED patterns and may be an indication that the film was grown in a three-dimensional mode.

Figure 6:
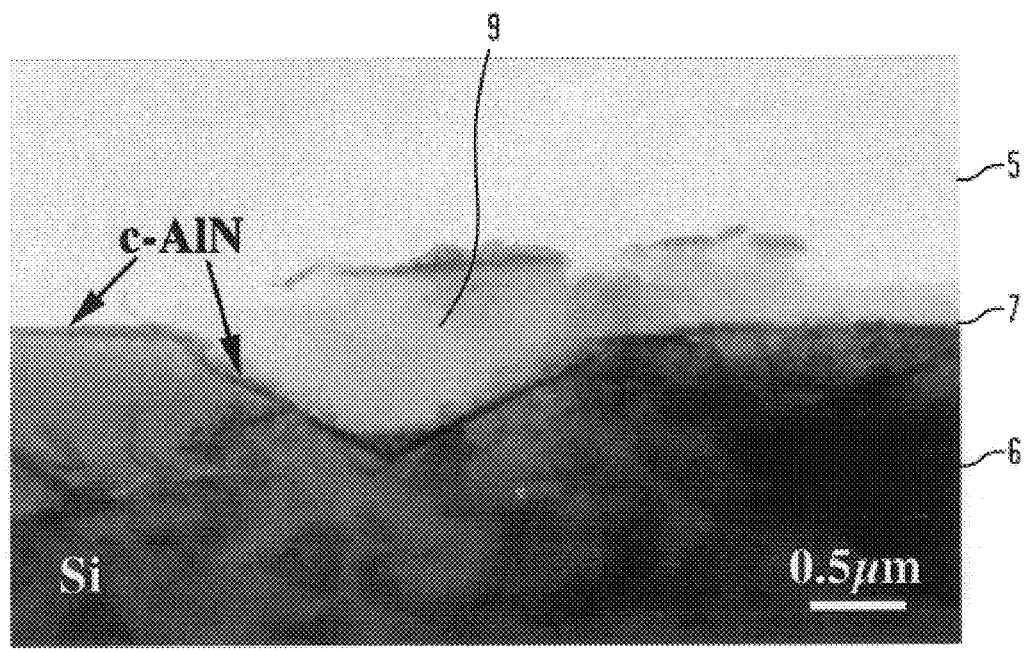
FIG. 6 is a TEM image of a pyramidal pit of the type shown in the AFM images of FIG. 5.

It was originally believed that these features were defects formed in order to reduce the tensile strain in the film due to the large lattice mismatch (~19%) between the zinc-blende film and the silicon substrate. However, reference to FIG. 6 shows a TEM image of a pyramidal pit 9 that is formed deep into the silicon substrate 6 and is covered evenly with the zinc-blende AlN film 5. This indicates that a chemical reaction between zinc-blende AlN and Si is unlikely. It is known, however, that 3C—SiC is deposited on pyramidal pits on Si(100) substrates similar to those observed in FIG. 5 in the presence of a carbon source. Therefore, it is believed that a layer of 3C—SiC forms on the Si(100) surface during the preheating step. Advantageously, cubic 3C—SiC has a lattice parameter of 4.348 Å which closely matches the lattice parameter of zinc-blende AlN. An interfacial layer 7 of 3C—Si is shown in FIG. 6.

Thus, in accordance with a preferred method embodiment of the present invention, the Si(100) substrate is subjected to a mixture of hydrocarbons as a source of carbon during processing so that a layer of cubic 3C—SiC will form on the Si(100) surface during preheating prior to deposition. The high temperature pre-heat (800° C.) decomposes hydrocarbons present on the Si(100) substrate. The source of silicon is the silicon substrate leading to the formation of pyramidal pits. The formation of a thin interfacial layer of 3C—SiC provides a cubic matrix, or template, for the growth of cubic zinc-blende AlN. In addition, it acts as a buffer layer that reduces strain in the zinc-blende film.

Figure 7A:
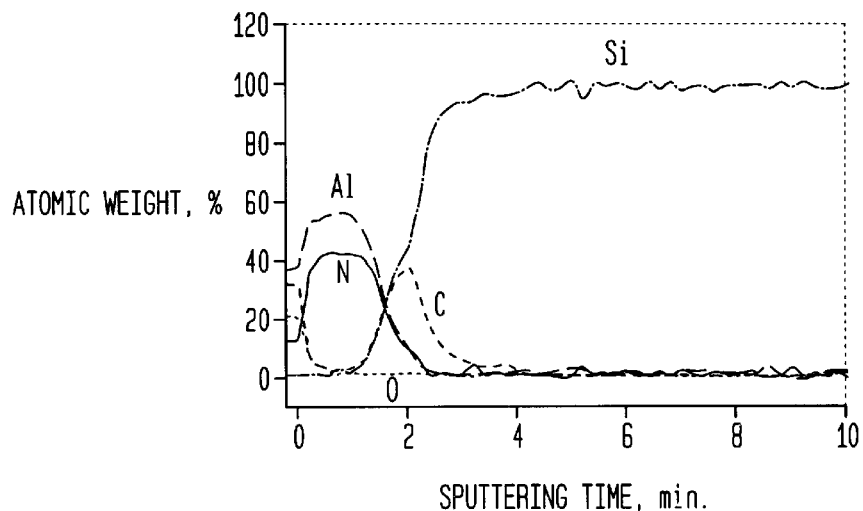
FIG. 7 is an Auger Electron Spectroscopy (AES) depth profile on zinc-blende AlN film specimens (FIG. 7a and FIG. 7b) fabricated in accordance with the present invention and a non-zinc-blende AlN film (FIG. 7c)
Figure 7B:
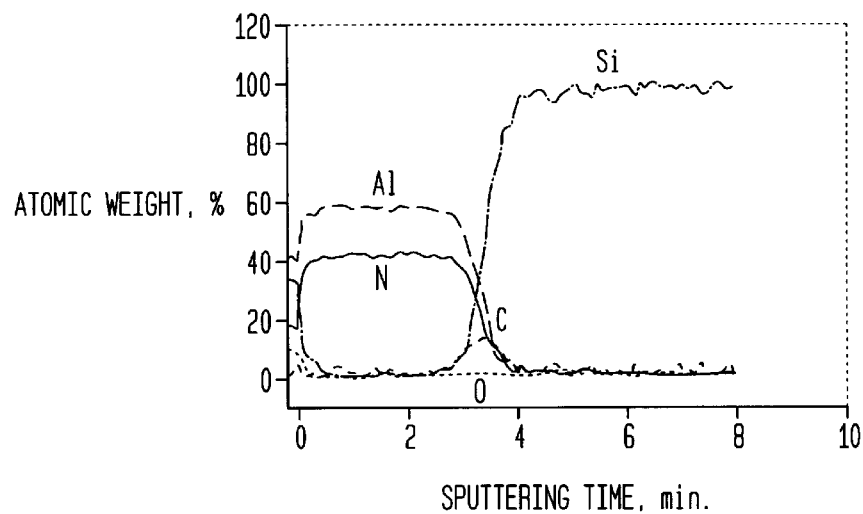
Figure 7C:
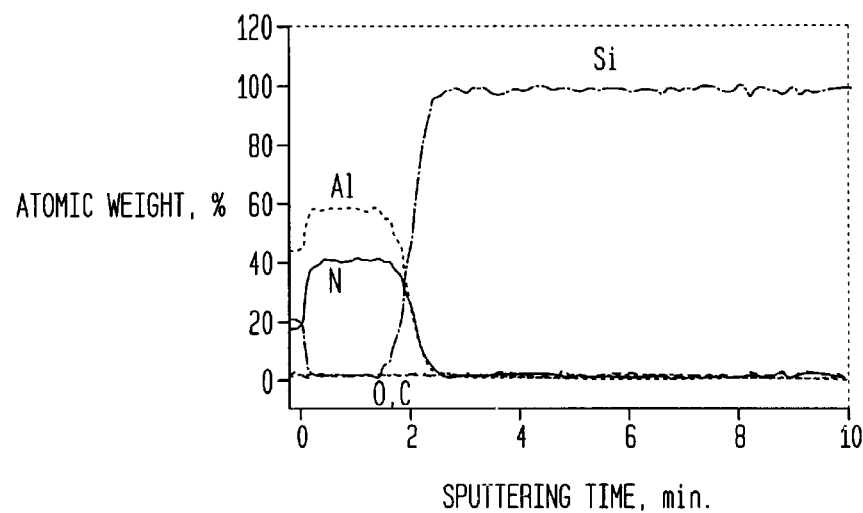

To confirm the formation of a 3C—SiC film, in this embodiment, at the zinc-blende AlN/Si interface, an AES depth profile was performed on Films 1 and 2 and the results are shown on FIG. 7. Data were recorded for Al, N, O, C, and Si in an alternating sputtering mode. A linear least square algorithm was applied to reduce the perceived noise present in the depth profile data. Both films (FIGS. 7a and 7b) clearly show the presence of a carbon and silicon rich layer at the interface. The thickness of this layer is estimated to be between 15–25 nm. No traces of carbon were found at the interface of a sample that was not subjected to hydrocarbon(s) during the pre-treating procedure (FIG. 7c). While the deposition conditions for the sample shown in FIG. 7c was identical to the conditions for Films 1 and 2, this sample did not have a zinc-blende structure.

Figure 8:
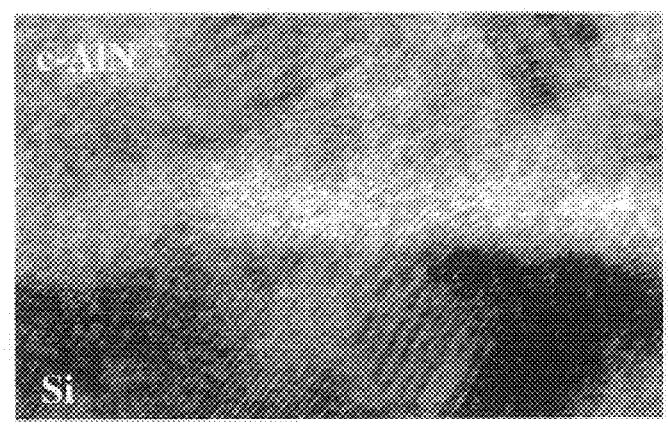
FIG. 8 is a High Resolution TEM (HRTEM) lattice fringe image in the [110] orientation of a specimen having a zinc-blende AlN film on a Si(100) substrate showing an interfacial layer at the zinc-blende AlN/Si(100) interface.

Although AES can indicate the presence of silicon and carbon at the interface between the zinc-blende AlN film and Si(100) substrate, it can not show whether these elements form SiC, or if SiC is formed, which of the more than 250 polytypes of SiC is present at the interface. High Resolution TEM was used to confirm the presence of an intermediate layer at the interface. FIG. 8 is an HRTEM lattice fringe image in the [110] orientation. The intermediate layer is approximately 25–30 Å thick and has a lighter contrast which is generally indicative of a material with an atomic number smaller than the atomic numbers for the zinc-blende AlN film and the Si substrate.

The average {111} interplanar spaces were assessed using a plot-profile technique to generate a density profile based on a rectangular selection from the lattice fringe image of FIG. 8 and a row-average plot. The {111} interplanar spacing for the zinc-blende AlN averaged over ten plot profiles was 2.52 Å while the {111} interplanar spacing for the interfacial layer was 2.496 Å. These values are in excellent correspondence with the theoretical values of 2.53 Å for zinc-blende AlN and 2.515 Å for 3C—SiC. Combined, the results of the AES depth profile and HRTEM confirm that an interfacial layer of 3C—SiC exists in Films 1 and 2.

Symmetric (Bragg-Brentano) and rocking KRD scans were performed on the films in a Scintag Xl θ-θ diffractometer using Cu K-α radiation and a Si(Li) detector. The samples were supported on zero-background quartz plates. The beam divergence was fixed at 1.4° and scans were collected in steps of 0.03° (2θ) with either 0.5 or 1 second/point.

Figure 9:
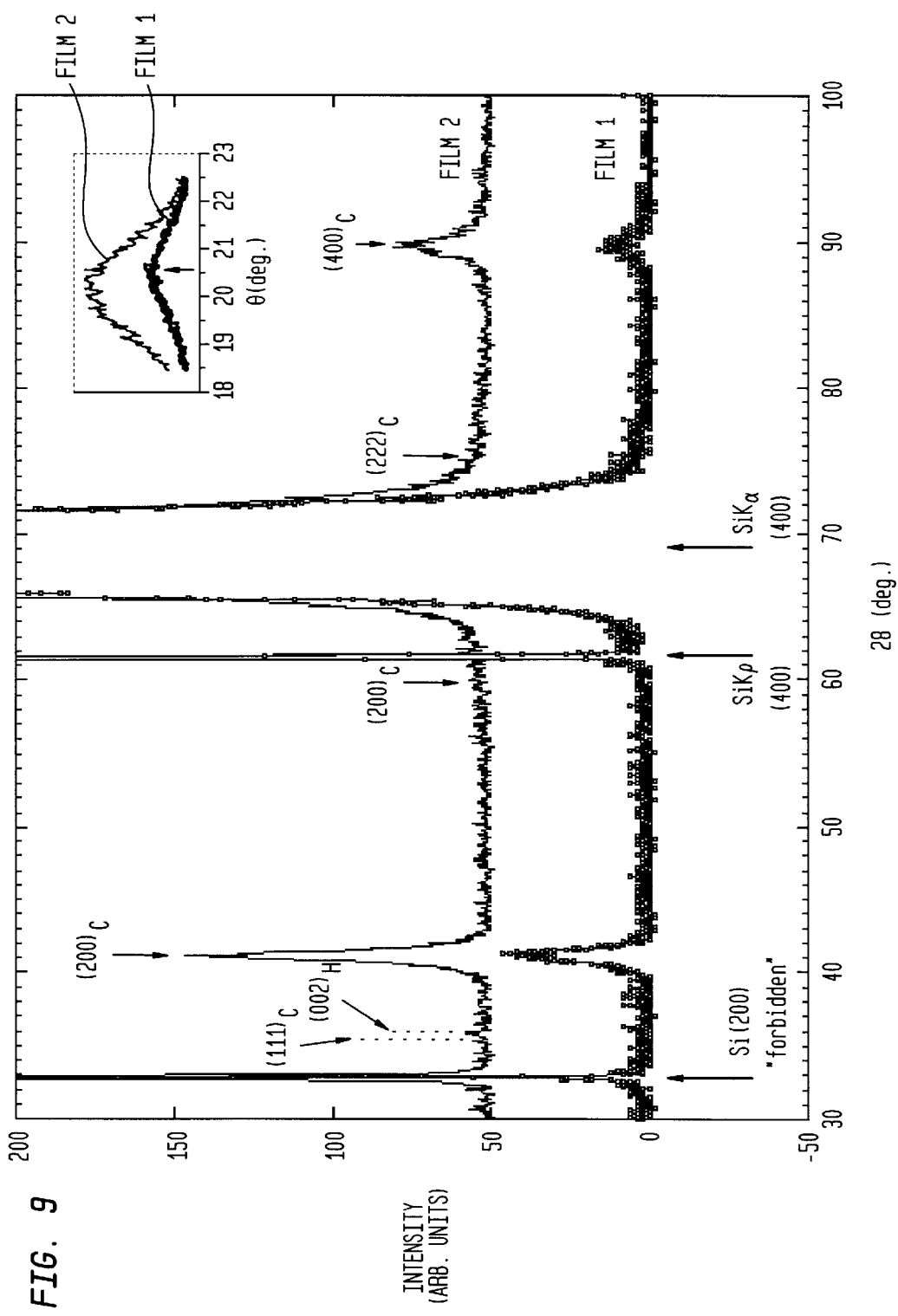
FIG. 9 shows symmetric XRD scans of two specimens of AlN grown on Si(001) substrates, an inset shows rocking scans of the same two specimens.

FIG. 9 shows the XRD symmetric scans for Film 1 and Film 2. The peak positions for the zinc-blende AlN layer and silicon substrate are labeled. Two strong peaks, corresponding to the cubic phase $(200)_C$ and $(400)_C$ reflection, are prominent. No peaks were observed for the $(220)_C$, $(002)_H$, or $(222)_C$ reflections (the $(311)_C$ peak is obscured by the Si (400)peak). A very weak intensity near 2q=36° can be detected on the XRD pattern of Film 2 and is possibly due to a trace of either $(002)_H$ or $(111)_C$. The measured positions of the (200) cubic peaks were corrected using the substrate peaks as internal standards. From the corrected positions, the lattice parameter of the cubic phase was determined to be 4.373±0.01 Å which closely matches the theoretical calculation.

Rocking scans about the $(200)_C$ peak position are shown for both Film 1 and Film 2 on the inset on FIG. 9. These scans display a peaked intensity near q=20.59° with a full width at half maximum (FWHM) of ~2°. The presence of only (h00) peaks, along with the peaked rocking scans, indicate that the zinc-blende AlN microcrystalline domains are mostly (100) oriented. The small misalignment of about 0.4° for Film 2 could be due, in part, to sample mounting in the diffractometer.

TEM studies were performed on Film 1 using a JEOL 2010 Transition Electron Microscope operated at 300 kV. Samples for TEM were prepared using the standard "sandwich" technique which included grinding, polishing, dimpling, and ion milling at the final stage. All TEM images, in plan view and in cross-section, were taken in bright field imaging conditions.

Figure 10:
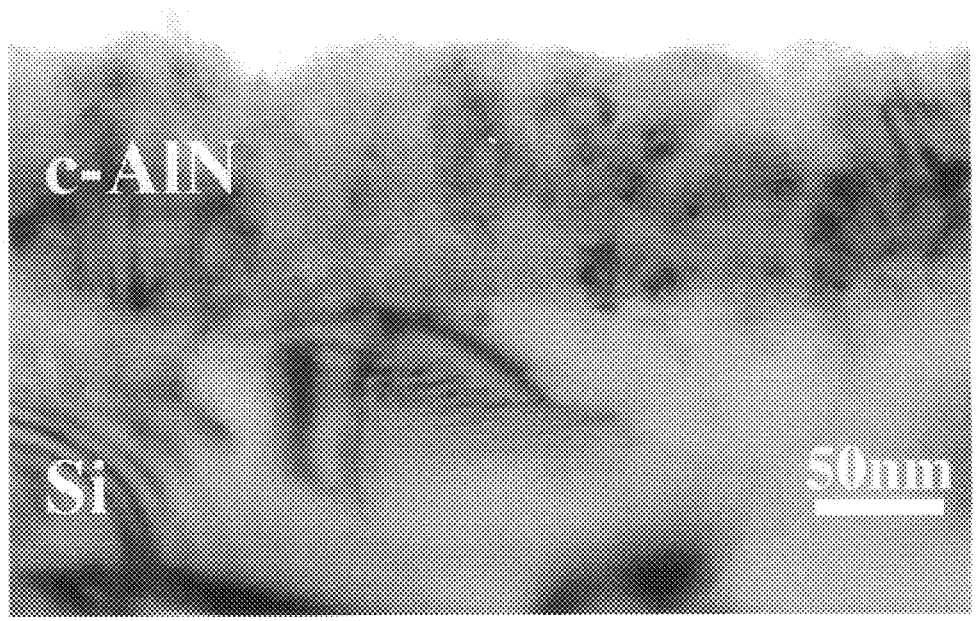
FIG. 10 is a cross-sectional view of the AlN/Si(001) interface in the [1$\bar{1}$0] orientation taken by transmission electron microscopy.

FIG. 10 shows a cross-sectional view of the AlN/Si(001) interface in the [1$\bar{1}$0] orientation of Film 1. The non-uniform distribution of the intensity in the film reveals regions of microcrystalline domains and the associated domain boundaries. The image shows a rough and non-uniform interface between the Si substrate and the AlN film due to the reaction resulting in the formation of 3C—SiC.

Figure 11:
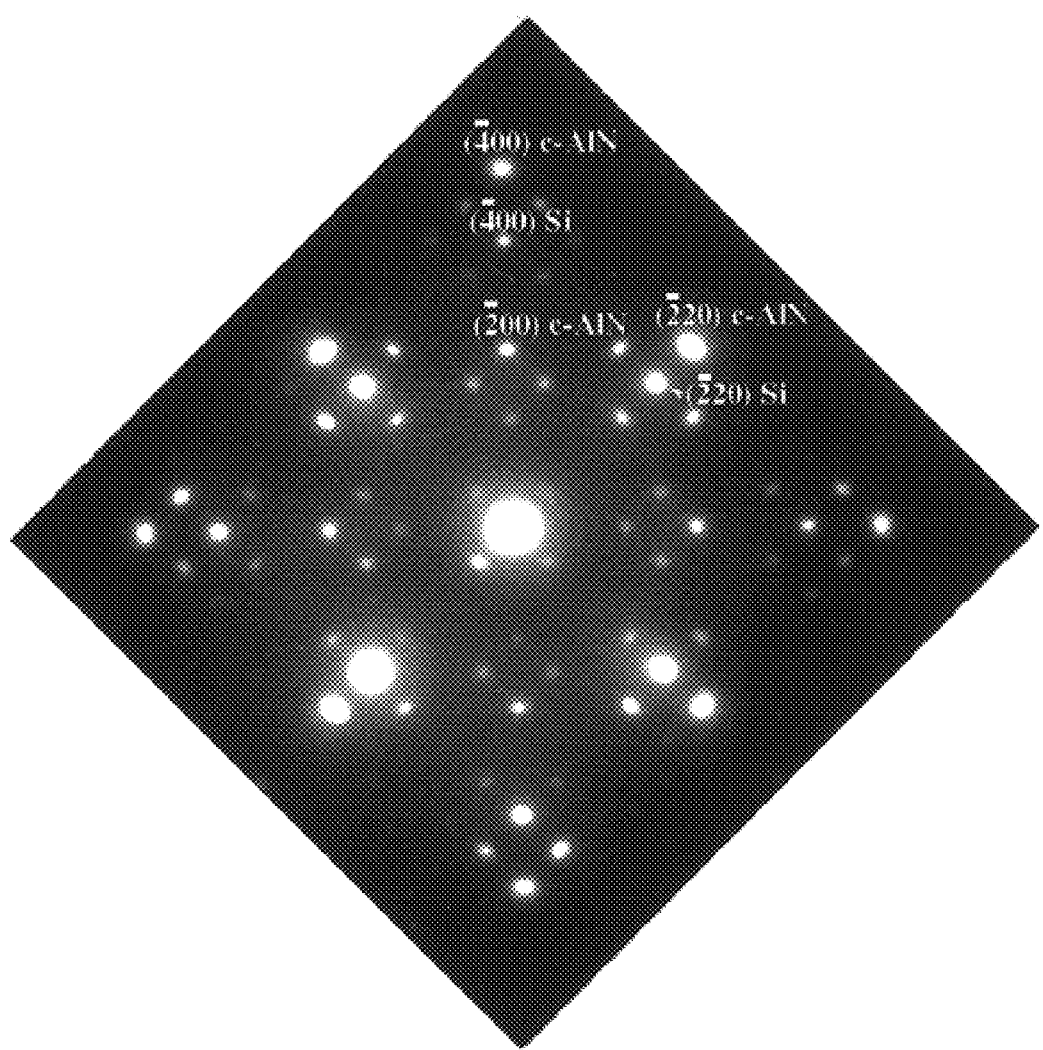
FIG. 11 is plan view TEM selected area diffraction (SAD) pattern in the [001] orientation which demonstrates that the AlN is a cubic zinc-blende AlN ($\beta$-AlN) structure.

Selected area diffraction (SAD) pattern, taken from numerous regions across the AlN/Si(001) interface, repeatedly reveals that the AlN film is of cubic crystal structure, as shown in FIG. 11. FIG. 11 is plan view SAD pattern in the [001] orientation which corresponds to a cubic zinc-blende AlN (β-AlN) structure having a lattice parameter of 4.383±0.01 Å. The cubic AlN film is single crystalline and epitaxial with respect to the Si(001) substrate. The very good crystallinity of the AlN film is revealed from the shape of the corresponding diffraction spots. Although not perfectly circular, as are the diffraction spots corresponding to the Si substrate, most of the AlN spots are very well localized, with angular distribution within about 1–1.5°.

Figure 12:
FIG. 12 is a cross-sectional SAD pattern of the AlN/Si (100) interface.

FIG. 12 is a cross-sectional SAD pattern of the AlN/Si (100) interface. The epitaxial nature of the AlN film is confirmed from the alignment between the spots of the AlN film and the Si substrate: (1$\bar{1}$1)c-AlN∥(1$\bar{1}$1)Si, (2$\bar{2}$0c-AlN∥(2$\bar{2}$0)Si on FIG. 12 and (400)c-AlN∥(400)Si and ($\bar{2}$20c-AlN∥($\bar{2}$20)Si on FIG. 11.

Optical Characterization of the Zinc-blende AlN Films

To date only theoretical calculations of the band gap of zinc-blende AlN have been reported. Zinc-blende AlN was predicted to be an indirect semiconductor with a bandgap of approximately 5.11 eV. This value is more than 1 eV smaller than the bandgap of wurtzite AlN (6.28 eV). Since the difference in bandgaps between wurtzite and zinc-blende GaN is only 0.2 eV, and equal bandgaps were predicted for wurtzite and zinc-blende InN, this value was expected to be closer to the bandgap of wurtzite AlN. Moreover, if zinc-blende AlN is indeed an indirect semiconductor, it may be possible to observe an indirect-direct bandgap transition in the alloys of the zinc-blende forms of AlN with GaN and InN which are both direct semiconductors.

Film 2 was characterized by spectroscopic ellipsometry using a Variable Angle Spectroscopic Ellipsometer (VASE) over the spectral range 0.73 eV–6.25 eV. Some error was introduced in the measurements due to the presence of the pyramidal pits on the surface of the sample which are large enough to scatter light before it can reach the detector. Oscillations in the ellipsometry data were observed to occur at lower energies due to interference. A parametric oscillator model was used to fit the optical data for zinc-blende AlN.

Figure 13A:
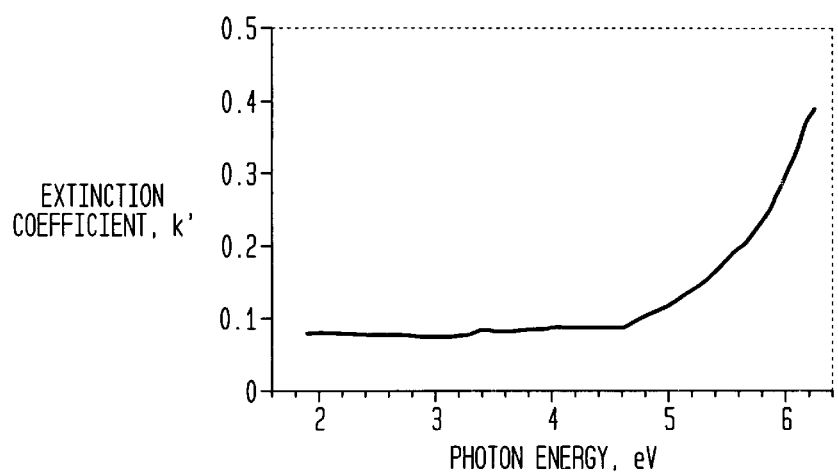
FIGS. 13a and b are extinction coefficient (k') data and refractive index (n') data, obtained by spectrophotometric ellipsometry, from a sample film of zinc-blende AlN on Si(100)
Figure 13B:
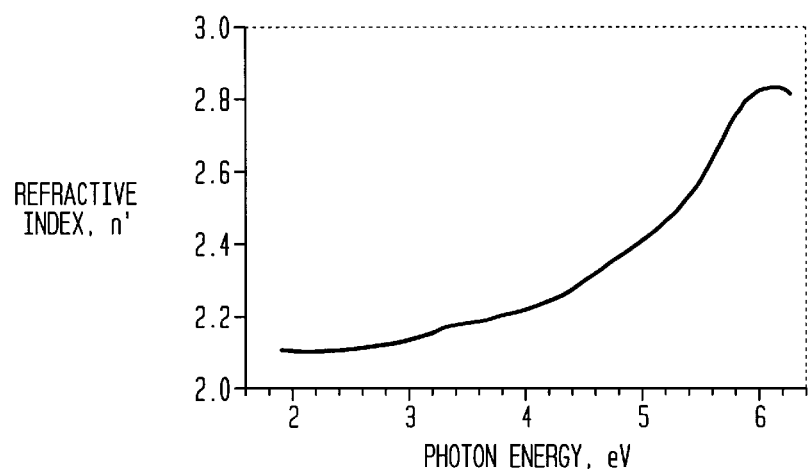

The index of refraction (n') and extinction coefficient (k') data obtained by the spectroscopic ellipsometry characterization of Film 2, in the range 1.8–6.25 eV, are presented in FIG. 13. The index of refraction of the zinc-blende AN film varied between 2.1 and 2.9 while the extinction coefficient was in the range of 0.08 to 0.40. At low energy, the data for the extinction coefficient has a constant nonzero value, which may be due to the small thickness of the film or the presence of the pyramids. Ideally, the extinction coefficient will be zero until bandgap absorption takes place. A gradual onset in absorption is observed to occur at around 5 eV due to interband transitions. Such gradual onset can be an indication that zinc-blende AlN is an indirect semiconductor which is in agreement with theoretical predictions. It can also be due to thickness effects or to the presence of the pyramidal pits on the sample surface. If the extinction coefficient data for zinc-blende AlN are compared to the data from a wurtzite AlN film with approximately the same thickness, a sharper onset in absorption is observed for the wurtzite film which is a direct semiconductor. This comparison suggests that zinc-blende AlN, fabricated in accordance with the present invention, is indeed an indirect semiconductor.

When the conduction band minium occurs at the same point in k space as the valence band maximum, the semiconductor is direct. If the minium of the conduction band occurs at a different point in k space than the maximum of the valence band, then the semiconductor is indirect. Based on the assumption that zinc-blende AlN has an indirect bandgap, the bandgap of zinc-blende AlN was estimated, from the extinction coefficient data. If the phonon energies compared to the total transition energy is ignored, absorption from interband transitions has the form:

$$\alpha_g(E) = C(E - E_g)^{1v-1}, \quad \text{Eq. (1)}$$

where 1=2 if the vertical optical transition at k=0 is allowed and 1=3 if the transition at k=0 is forbidden, E=hv is the photon energy, and $E_g$ is the bandgap. The extinction coefficient is related to the absorption by:

$$k' = \alpha\lambda/4\pi \qquad \text{Eq.(2)}$$

Figure 14:
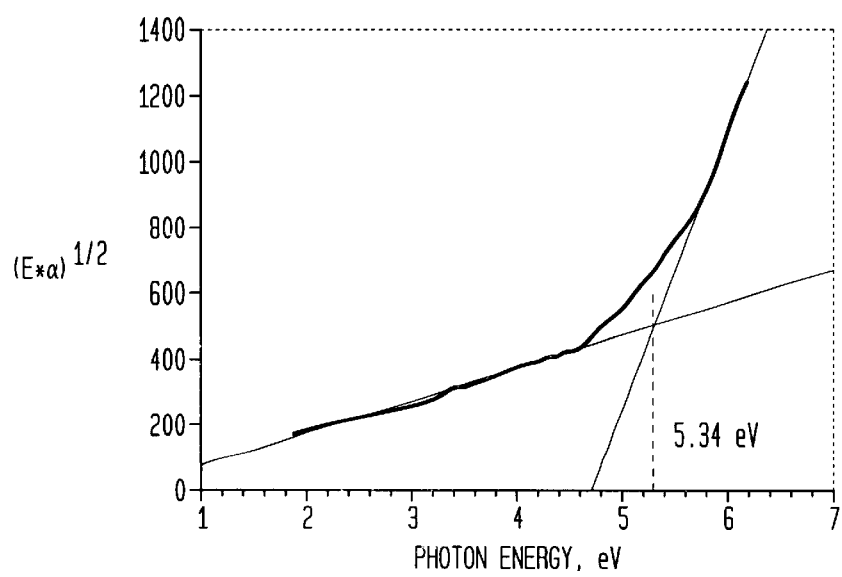
FIG. 14 is a plot of extinction coefficient data as $(E\alpha')^{1/2}$ as a function of photon energy in eV that provides an experimental estimate of the bandgap of zinc-blende AlN.

By re-plotting the extinction coefficient data as $(E\alpha)^{1/2}$ as a function of the photon energy at $1=2$, the lowest indirect bandgap can be obtained from a linear fit to the appropriate range of the curve. FIG. 14 shows such a plot. The data exhibit two ranges of liner dependence. The one at lower energies may be related to the presence of pyramids on the sample surface or a thickness effect. The linear range at higher energies is related to interband transitions, as shown in Eq. (1). The bandgap would be approximately the x-axes coordinate of the intersection point of two tangents as shown in FIG. 14. The first is the tangent to that part of the plot which corresponds to surface roughness or thickness effect and the second tangent follows the part of the plot which corresponds to absorption from the bandgap. In this fashion, the bandgap of zinc-blende AlN is approximately calculated to be at 5.34 eV. This value is in reasonable agreement with the theoretical value of 5.11 eV previously reported and confirms that the bandgap of zinc-blende AlN is on the order of 1 eV smaller than the bandgap of wurtzite AlN.

The material of the present invention has many uses, including but not limited to, use as a substrate and as a template for growing cubic crystals with conventional systems, such as a chemical vapor deposition system. Although this wide bandgap semiconductor is somewhat resistant to defects or imperfections in the material, it is believed that less defects will occur in an epilayer grown on a cubic substrate.

Among the anticipated uses of cubic zinc-blende AlN are ultraviolet photonic detectors and surface acoustic wave sensors. It can also be used as a dielectric coating for enhancement of Kerr rotation in optical storage media and as an insulator for silicon carbide-based devices. Furthermore, the wurtzite polytypes of InN, GaN, and AlN form a continuous alloy system with direct band gaps ranging from 1.9 eV for InN to 6.2 eV for AlN. Thus, AlN in combination with other nitrides could potentially be fabricated into optical devices that are active at optical wavelengths ranging from red well into the UV. Moreover, since the cubic structure is expected to be easy to dope, the material will be useful for p-n junction devices.

The following is a list of exemplary devices, and is in no way intended to be limiting: surface or other acoustic wave devices for chemical gas and biological detectors, heterojunction field effect transistors, ultraviolet photonic sensors, pyroelectric and piezoelectric-based sensors, field effect transistors and bipolar junction transistors, microwave and millimeter wave detectors, schottky and p-n junction diodes, metal-insulator-semiconductor capacitors, microwave field effect transistors, radiation detectors and x-ray/radiation imagers, flat panel display electron emitters, and thermal (electrically insulating) heat sinks for electronic packaging.

Figure 15:
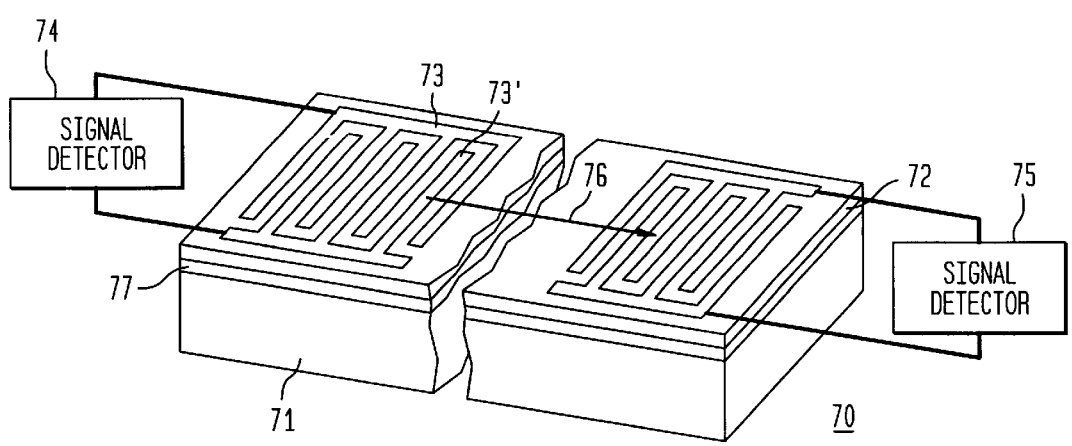
FIG. 15 is a schematic representation of an interdigitated transducer SAW device fabricated from the zinc-blende AlN of the present invention.

In a specific illustrative device embodiment, shown in FIG. 15, an interdigitated transducer SAW device 70 comprises a substrate 71, illustratively Si(100), a buffer layer 77 of 3C—SiC, an epitaxial film 72 of single crystal, zinc-blende AlN oriented (100) on the substrate. The zinc-blende AlN film 72 has a patterned film of two interdigitated electrodes 73 and 73' deposited on it by standard photolithographic techniques. A signal generating source 74 is connected across one end of the electrodes 73 and a signal detector 75 is connected across the other (73'). When an alternating voltage is applied to the electrodes, a surface acoustic wave is generated that travels along the device in the direction of arrow 76 and is detected by signal detector 75.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A semiconductor device comprising a film of device-quality, single crystal cubic zinc-blende AlN having a thickness of at least 800 Å.

2. The film of claim 1 wherein the cubic zinc-blende AlN has a lattice parameter of approximately 4.373 Å.

3. A semiconductor device comprising:

a substrate; and a layer of single crystal epitaxial zinc-blende AlN on a face surface of the substrate, the layer of epitaxial zinc-blende AlN having a thickness of at least 800 Å.

4. The semiconductor device of claim 3 wherein the substrate has cubic symmetry on its growth surface.

5. The semiconductor device of claim 4 wherein the substrate is selected from the group consisting of Si(100), MgO(100), 3C—SiC and combinations thereof.

6. The semiconductor device of claim 4 wherein the cubic substrate is Si(100) with a surface layer of 3C—SiC.

7. A semiconductor device comprising:

a Si(100) substrate;

a layer of 3C—SiC on a first surface of the Si(100) substrate; and a film of single crystal epitaxial zinc-blende AlN on the layer of 3C—SiC, oriented epitaxial to the (100) plane.

8. The semiconductor device of claim 7 wherein the zinc-blende AlN has a thickness of at least 800 Å.

9. The semiconductor device of claim 8 wherein the zinc-blende AlN has a thickness in the range of at least about 1000 Å to 2000 Å.

10. A surface acoustic wave device comprising:

a substrate;

a single crystal epitaxial layer of cubic zinc-blende AlN having a thickness of at least 800 Å deposited on the substrate; and electrodes on the surface of the epitaxial layer of cubic zinc-blende AlN for converting an electrical signal to a surface acoustic wave and for converting the generated surface acoustic wave into an electrical signal.

11. The surface acoustic wave device of claim 10 wherein the substrate has a cubic symmetry on its growth surface.

12. The surface acoustic wave device of claim 11 wherein the substrate is Si(100) with a layer of cubic 3C—SiC thereon.

13. The semiconductor device of claim 9 wherein the zinc-blende AlN has a thickness in the range of at least about 1000 Å to 2000 Å.

* * * * *